US 6,632,549 B1

(12) United States Patent
Ohashi et al.

(10) Patent No.: US 6,632,549 B1
(45) Date of Patent: Oct. 14, 2003

(54) CORROSION-RESISTANT MEMBER, WAFER-SUPPORTING MEMBER, AND METHOD OF MANUFACTURING THE SAME

(75) Inventors: Tsuneaki Ohashi, Ogaki (JP); Kiyoshi Araki, Nagoya (JP); Sadanori Shimura, Iwakura (JP); Yuji Katsuda, Tsushima (JP)

(73) Assignee: NGK Insulators, Ltd. (JP)

( * ) Notice: Subject to any disclaimer, the term of this patent is extended or adjusted under 35 U.S.C. 154(b) by 0 days.

(21) Appl. No.: 09/618,135

(22) Filed: Jul. 17, 2000

Related U.S. Application Data

(62) Division of application No. 09/102,582, filed on Jun. 23, 1998, now Pat. No. 6,139,983.

(30) Foreign Application Priority Data

Jul. 15, 1997 (JP) .............................. 9-203955
Nov. 12, 1997 (JP) .............................. 9-325171

(51) Int. Cl.⁷ ................................. B32B 9/00
(52) U.S. Cl. ........................ 428/698; 428/336
(58) Field of Search .................. 428/469, 457, 428/698, 336, 704

(56) References Cited

U.S. PATENT DOCUMENTS

| 4,698,320 A | 10/1987 | Kasori et al. ................. 501/96 |
| 4,711,861 A | 12/1987 | Sawamura et al. ............ 501/98 |
| 4,746,637 A | 5/1988 | Kasori et al. ................. 501/98 |
| 5,063,183 A | 11/1991 | Taniguchi et al. ............. 501/96 |
| 5,314,850 A | 5/1994 | Miyahara ...................... 501/153 |
| 5,409,869 A | 4/1995 | Ueno et al. ................... 428/698 |

FOREIGN PATENT DOCUMENTS

| EP | 0 506 391 A1 | 9/1992 |
| EP | 0 702 098 A1 | 3/1996 |
| JP | 4-66657 | 3/1992 |
| JP | 4-99282 | 3/1992 |
| JP | 4-191379 | 7/1992 |
| JP | 5-251365 | 9/1993 |
| JP | 6-163428 | 6/1994 |
| JP | 7-273053 | 10/1995 |
| JP | 8-208338 | 8/1996 |
| JP | 9-180627 | 7/1997 |

OTHER PUBLICATIONS

Chemical Abstracts, vol. 128, No. 7; Feb. 16, 1998; Columbus, Ohio; abstract No. 78835; Toyoda et al.: "Aluminum Nitride Substrate for Semiconductor Manufacturing Devices and the Manufacture" XP002082671 *abstract* & JP 09 328382 A (Mitsubishi Materials Corp) & Patent Abstracts of Japan, vol. 98, No. 4; Mar. 31, 1998 & JP 09 328382 A (Mitsubishi Mitsubishi Materials Corp) *abstract; claim 14*.

Primary Examiner—Archene Turner
(74) Attorney, Agent, or Firm—Parkhurst & Wendel, L.L.P.

(57) ABSTRACT

This invention relates to a corrosion-resistant member having a resistance to plasma of a halogen based corrosive gas, which comprises a main body and a corrosion-resistant layer formed on a surface of the main body and containing a fluoride of at least one element selected from the group consisting of rare earth elements and alkaline earth elements.

8 Claims, 3 Drawing Sheets

US 6,632,549 B1

CORROSION-RESISTANT MEMBER, WAFER-SUPPORTING MEMBER, AND METHOD OF MANUFACTURING THE SAME

This is a Division of application Ser. No. 09/102,582 filed Jun. 23 1998 now U.S. Pat. No. 6,139,983.

BACKGROUND OF THE INVENTION

1. Field of the Invention

This invention relates to a corrosion-resistant member having a resistance to a plasma of a halogen based corrosive gas, a wafer-supporting member using the same, and a method of manufacturing the corrosion resistant member.

2. Description of Related Art

Processes requiring a chemical reaction become increased as fine machining more proceeds with the increase of a memory capacity in super LSI. Especially, in a semiconductor manufacturing apparatus requiring a super clean condition, a halogen based corrosive gas such as chlorine based gas, fluorine based gas or the like is used as a gas for deposition, etching or cleaning.

For example, when a heat CVD device or the like is used as a heating device in the semiconductor manufacturing apparatus for heating at a state of contacting with these corrosive gases, a halogen based corrosive gas such as $ClF_3$, $NF_3$, $CF_4$, HF, HCl or the like is used as a gas for cleaning the semiconductor after deposition. And also, a halogen based corrosive gas such as $WF_6$, $SiH_2Cl_2$ or the like is used as a gas for forming a film at the deposition stage.

The inventors have disclosed in JP-A-5-251365 that an aluminum nitride sintered body provided on its surface with an aluminum fluoride layer has a high corrosion resistance against a plasma of the above halogen based corrosive gas. Namely, even when the aluminum nitride sintered body is exposed to, for example, $ClF_3$ gas for one hour, no change of the surface state is observed.

Furthermore, the inventors have disclosed that an aluminum fluoride film is formed on the surface of the aluminum nitride sintered body by a gas phase method such as a CVD method or the like (JP-A-5-251365). And also, JP-A-7-270353 discloses that in order to prevent the occurrence of corrosion in a surface of an electrostatic chuck for a semiconductor wafer, the surface of the electrostatic chuck is previously subjected to a surface treatment replacing with fluorine to form $AlF_3$ on the surface of the electrostatic chuck.

However, the inventors have made various studies and confirmed that when the aluminum nitride-base ceramic body is exposed to the halogen based corrosive gas such as $ClF_3$ or the like in a high temperature range, particularly above 500° C., the corrosion of the ceramic is promoted in accordance with the exposure condition to create particles.

SUMMARY OF THE INVENTION

It is, therefore, an object of the invention to provide a corrosion-resistant member capable of preventing the occurrence of corrosion and hence the occurrence of particles even when it is exposed to a plasma of a halogen based corrosive gas over a wide temperature range of from low temperature to high temperature, especially a high temperature range of not lower than 500° C.

According to a first aspect of the invention, there is the provision of a corrosion-resistant member having a resistance to plasma of a halogen based corrosive gas, comprising a main body and a corrosion-resistant layer formed on a surface of the main body, in which the corrosion-resistant layer contains a fluoride of at least one element selected from the group consisting of rare earth elements and alkaline earth elements.

According to a second aspect of the invention, there is the provision of a wafer-supporting member exposed to a plasma of a halogen based corrosive gas, comprising a main body and a corrosion-resistant layer formed on a surface of the main body, in which the corrosion-resistant layer contains a fluoride of at least one element selected from the group consisting of rare earth elements and alkaline earth elements.

In general, a corrosion-resistant ceramic indicates an ion reactivity for an acid or alkaline solution. In the invention, however, the ion reactivity is not noticed, but a reactivity for a redox reaction through a halogen in a dry gas or plasma is noticed.

The inventors have investigated a reason why the corrosion proceeds in the aluminum nitride-base ceramic body provided with a passive coating of aluminum fluoride or the like when being particularly exposed to the plasma of the halogen based corrosive gas in the high temperature range. As a result, in the corrosion-resistant member wherein the corrosion is proceeding, the passive coating made of aluminum fluoride substantially disappears from the surface of the ceramic, while aluminum nitride-base particles existing under the passive coating are corroded and also a grain boundary phase existing between the aluminum nitride particles is subjected to the corrosion.

Although the reason of causing such a corrosion is not clear, it is considered that since a vapor pressure of $AlF_3$ is relatively high and a temperature of rendering the vapor pressure of $AlF_3$ 0.001 Torr is about 695° C., a process of evaporation of $AlF_3$ proceeds in the high temperature range and hence the corrosion of aluminum nitride particles begins from the vicinity of the region where the passive coating made of $AlF_3$ disappears.

For example, the temperature of rendering the vapor pressure 0.001 Torr is 1066° C. in $MgF_2$, 1195° C. in $CaF_2$, 1233° C. in $SrF_2$, 1065° C. in $BaF_2$, 975° C. in $ScF_3$, 1100° C. in $PrF_3$, 1134° C. in $EuF_2$, and 695° C. in $AlF_3$.

In order to solve the above problem, the inventors made further studies and found that when aluminum nitride ceramic body containing a specific sintering aid is corroded under violent corrosion conditions, the proceeding of corrosion stops at a certain time and a novel passive coating having a considerably excellent corrosion resistance is unexpectedly formed on the surface of the ceramic body. Surprisingly, this coating has an extremely high corrosion resistance to the plasma of the halogen based corrosive gas above 500° C.

According to a third aspect of the invention, there is the provision of a method of manufacturing a corrosion-resistant member, which comprises the steps of: firing a powder containing 100 parts by weight of aluminum nitride and not less than 100 ppm but not more than 60 parts by weight of at least one element selected from the group consisting of rare earth elements and alkaline earth elements to produce a dense aluminum nitride ceramic sintered body; and then holding the sintered body in a plasma of a fluorine containing gas at a temperature of 500° C.–1000° C. to form a corrosion-resistant layer.

According to a fourth aspect of the invention, there is the provision of a method of manufacturing a corrosion-resistant member, which comprises the steps of: providing an aluminum nitride ceramic main body comprising aluminum nitride-base grains and grain boundary phase existing in grain boundaries of the aluminum nitride-base grains and containing in its grain boundary at least one element selected from the group consisting of rare earth elements and alkaline earth elements; and then holding the main body in a plasma of a fluorine containing gas at a temperature of 500° C.–1000° C. to form a corrosion-resistant layer.

In the sintering of aluminum nitride, a sintering aid such as yttria or the like may be added in order to promote the sintering process and raise a thermal conductivity and a mechanical strength of the resulting sintered body. After the completion of the sintering, a great amount of such a sintering aid is existent in the grain boundary phase of the aluminum nitride grains. In the conventional knowledge, it is considered that when aluminum nitride ceramic body containing the sintering aid is exposed to the plasma of the halogen based corrosive gas, fluorine radicals or the like diffuse along the grain boundary phase to change the volume of the grain boundary and hence aluminum nitride grains are detached to prematurely cause the corrosion.

However, it is surprisingly discovered that when such an aluminum nitride ceramic body is exposed to the plasma of the halogen corrosive gas at a high output under a specified sever condition of high temperature, the passive coating as mentioned above is formed.

The passive coating contains a fluoride of a rare earth element or an alkaline earth element as a prominent ingredient. It is considered that such an ingredient has the same high corrosion resistance as the aluminum fluoride and is difficult to evaporate even at a higher temperature as compared with the aluminum fluoride, which contributes to considerably improve the corrosion resistance of the corrosion-resistant member according to the invention against the plasma of the halogen based corrosive gas.

The inventors have made further studies and found that even when a main body made of material other than the aluminum nitride ceramic body is used as a main body of the corrosion-resistant member and a corrosion-resistant layer made of a fluoride of at least one element selected from the group consisting of rare earth elements and alkaline earth elements is formed on a surface of the main body by a gas phase method or the like, a high corrosion resistance against the halogen based corrosive gas can be obtained at an extremely high temperature range over a long time.

In this case, the corrosion-resistant layer is particularly preferable to be a film made of the fluoride, which can provide substantially a homogeneous protection over a wide range.

Explaining in more detail, the stability against fluorine based gas as well as chlorine based gas and bromine based gas having an electronegativity lower than that of fluorine can be ensured by forming a compound layer of fluorine having a high electronegativity. And also, the stability at a high temperature can be obtained by using the fluoride of a rare earth element or an alkaline earth element having a low vapor pressure.

As the fluoride, the aforementioned products are preferable, and magnesium fluoride is particularly preferable.

Further, the main body is preferable to be made of a material selected from the group consisting of a metal aluminum, a metal silicon, a thermal-resistant alloy, a silicon nitride-base ceramic, a silicon carbide base ceramic, alumina, boron carbide and silicon oxide.

Furthermore, the inventors have further studied and found that the corrosion-resistant layer of the fluoride can be produced by forming a surface layer made of a compound of at least one element selected from the group consisting of rare earth elements and alkaline earth elements on the surface of the main body and holding such a surface layer in a plasma of fluorine containing gas at a temperatures of 500–1000° C. Thus, the corrosion-resistant layer of the fluoride can be produced more surely and easily.

The material of the surface layer is not particularly limited, but it is preferable to be a single oxide of a rare earth element and aluminum or an oxide of two or more metals. The surface layer is more preferable to be made of one or more oxides selected from the group consisting of $Y_2O_3$—$Al_2O_3$ two-component system oxide and $Y_3Al_5O_{12}$.

DESCRIPTION OF THE PREFERRED EMBODIMENT

The invention will be explained more concretely below.

It has been found that the corrosion-resistant member according to the invention is stable against a plasma of a halogen based corrosive gas such as $ClF_3$ gas, $NF_3$ gas, $CF_4$ gas or $WF_6$ gas as well as $Cl_2$ gas, $BCl_3$ gas or the like.

When the corrosion-resistant member according to the invention is used as a wafer-supporting member, particularly as a susceptor for supporting a semiconductor wafer, there can be provided a structural part being stable against a cleaning gas or an etching gas and also the generation of particles or contamination resulting in the reject of the semiconductor can be prevented over a long period. Thus, the invention can be first applied even to the manufacture of a high integrated semiconductor such as DRAM, 4M or the like.

The invention is very useful irrespectively of the film-forming and cleaning for the semiconductor when the invention is applied to a susceptor generating heat by heating through an infrared lamp, a ceramic heater for heating a semiconductor, a susceptor disposed on a heating surface of the ceramic heater, a susceptor embedding an electrode for an electrostatic chuck therein, a susceptor embedding an electrode for an electrostatic chuck and a heating resistor therein, a susceptor embedding an electrode for generating a high frequency plasma therein, or a susceptor embedding an electrode for generating a high frequency plasma and a heating resistor therein. Because it is desired to develop a useful material as these parts may be exposed to a halogen based corrosive gas at a high temperature of not lower than 500° C.

Further, the corrosion-resistant member according to the invention can be used as a substrate for the semiconductor manufacturing apparatus such as a dummy wafer, a shadow ring, a tube for generating a high frequency plasma, a dome for generating a high frequency plasma, a high frequency transmitting window, an infrared transmitting window, a lift pin for supporting a semiconductor wafer, a shower plate or the like.

Since the metal member embedded in the susceptor is usually fired together with the aluminum nitride powder, it is preferable to be made of a metal having a high melting point. As such a high melting point metal, mention may be made of tantalum, tungsten, molybdenum, platinum, rhenium, hafnium, and an alloy thereof. From a viewpoint of the prevention of a semiconductor from contamination, tantalum, tungsten, molybdenum, platinum and alloys thereof are more preferable.

And also, the cleaning gas or etching gas made of the halogen based corrosive gas is used in a chemical industry other than the semiconductor manufacturing industry, so that the corrosion-resistant member according to the invention is useful even in the field of the chemical industry.

As the rare earth element, Y, Yb, Ce, Pr and Eu are particularly preferable, and as the alkaline earth element, Mg, Ca, Sr, and Ba are preferable.

Among these elements, an element having an ion radius of not less than 0.9 angstrom is particularly preferable. The ion radius is an ion radius in six coordination defined through a method described by R. D. Shannon and C. T. Prestwitz, "Acta Cryst." B25, p925 (1969). As such an ion radius, there are $La^{3+}$, $Ce^{3+}$, $Pr^{3+}$, $Nd^{3+}$, $Sm^{3+}$, $Eu^{3+}$, $Eu^{2+}$, $Gd^{3+}$, $Tb^{3+}$, $Dy^{3+}$, $Ca^{2+}$, $Sr^{2+}$, $Ba^{2+}$ and $Ra^{2+}$.

In the above manufacturing methods according to the invention, powder obtained by a direct nitriding method can be used as a powdery aluminum nitride raw material, and also powder obtained by a reductive nitriding method may be used.

The rare earth element and/or the alkaline earth element may be added to the powdery aluminum nitride raw material in various forms. For example, powder of a single body or compound of the rare earth element and/or the alkaline earth element may be added to the aluminum nitride raw material powder. When the amount added as the sintering aid exceeds 60 parts by weight, the thermal conductivity of the resulting aluminum nitride ceramic body decreases to less than 60 W/(m·K) and tends to be not practical.

As the compound of the rare earth element or the alkaline earth element, an oxide of a rare earth element is generally most available. The compound of the rare earth element or the alkaline earth element such as nitrate, sulfate, alkoxide, fluoride or the like is dissolved in a proper solvent capable of dissolving such a compound to obtain a solution, which may be added to the powdery aluminum nitride raw material. Thus, the rare earth element is easy to be uniformly dispersed into any portions of the sintered body.

In the preparation step, the powdery aluminum nitride raw material is dispersed into the solvent, to which may be added the compound of the rare earth element and/or the alkaline earth element in the form of oxide powder or solution. The mixing may be carried out by simple stirring, but if it is required to pulverize aggregates in the powdery raw material, a mixing and pulverizing machine such as pot mill, trommel, attrition mill or the like may be used. In the case of using an additive soluble in the solvent for pulverization, the time of conducting the mixing and pulverizing step may be a shortest time required for the pulverization of the powder. Moreover, a binder such as polyvinyl alcohol or the like may be added.

A spray drying process is preferable for the step of drying the solvent for pulverization. And also, it is preferable to adjust a grain size of a dried powder through a sieve after the conduction of a vacuum drying process.

In the powder shaping step, a mold pressing process may be employed for the manufacture of a disc-shaped body. In this case, a shaping pressure is preferable to be not less than 100 $kgf/cm^2$, but is not particularly limited if it is possible to maintain the shaping. Further, the shaping material may be filled in a hot press die in the form of powder. When the binder is added to the shaped body, the degreasing may be carried out at a temperature of 200–800° C. in an oxidizing atmosphere prior to the firing.

Then, the shaped body is preferably fired by a hot pressing process, a hot isostatic pressing process or the like. The pressure in the hot pressing process or the hot isostatic pressing process is preferable to be not less than 50 $kgf/cm^2$, more particularly not less than 200 $kgf/cm^2$. The upper limit of the pressure is not particularly restricted, but is practically not more than 1000 $kgf/cm^2$ in order to prevent the damage of the furnace tool such as a mold or the like.

Further, it is preferable to raise the temperature at a temperature rising rate of not less than 50° C./hour but not more than 1500° C./hour up to a maximum temperature in the firing. The maximum temperature is preferable to be 1700–2300° C. When the maximum temperature exceeds 2300° C., aluminum nitride begins to decompose. When the maximum temperature is lower than 1700° C., the effective grain growth is restrained.

When the aluminum nitride-base ceramic body as the sintered body or the like is held in a plasma of a fluorine-containing gas at 500–1000° C., it is rather preferable to adopt a severe condition. For example, a temperature is preferable to be 600–800° C., and a plasma power is preferable to be not less than 500 W. A formation stage of the corrosion-resistant layer at this process will be further explained below.

The method of producing the film made of the fluoride on the main body is not particularly limited so long as defects and pin-holes are not formed in the film. However, if the shape of the main body is complicated or large, an ion plating method is preferable, while if it is a simple shape such as a cover plate or a small type, a sputtering process is preferable. Moreover, when the coating is carried out by these method, it is favorable that the surface of the main body is previously cleaned by a method such as a reverse sputtering or the like. And also, a chemical vapor growth method, a spraying method and a powder coating plus heat treatment may be adopted.

The thickness of the corrosion-resistant layer is not particularly limited so long as defects such as cracking, peeling or the like are not generated. If the corrosion-resistant layer is too thick, fracture, cracking or the like is liable to be caused in the corrosion-resistant layer by heat stress based on the difference of thermal expansion between the substrate and the corrosion-resistant layer, so that the thickness is preferable to be not more than 10 μm, more particularly not more than 4 μm.

In order not to form the pin-hole in the corrosion-resistant layer, the thickness is preferable to be not less than 0.2 μm, more particularly not less than 1 μm.

BRIEF DESCRIPTION OF THE DRAWINGS

The invention will be described with reference to the accompanying drawings, wherein.

DESCRIPTION OF THE PREFERRED EMBODIMENTS

The following examples are given in illustration of the invention and are not intended as limitations thereof.

EXAMPLE 1

Manufacture of an Aluminum Nitride-Base Ceramic Body

At first, an aluminum nitride-base ceramic body is manufactured as follows. As a powdery raw material is used aluminum nitride powder obtained by a reductive nitriding method. An additive solution is prepared by dissolving yttrium nitrate in isopropyl alcohol and mixed with the powdery aluminum nitride raw material in a pot mill. An amount of yttrium added is 4 parts by weight based on 100 parts by weight of aluminum nitride. Yttrium has an ion radius of 0.89 angstrom.

A disc-shaped body having a diameter of 200 mm is produced by uniaxial pressing the mixed powder under a pressure of 200 kgf/cm². The disc-shaped body is placed in a hot pressing mold and sealed hermetically. The temperature in the mold is raised at a temperature rising rate of 300° C./hour, during which the pressure is reduced over a temperature range of from room temperature to 1000° C. After the temperature reaches 1000° C., the pressure is raised up to 200 kgf/cm² stepwise while introducing a nitrogen gas at 2 atm. The maximum temperature is set to 1900° C. and held for 4 hours. Then, an aluminum nitride sintered body is obtained by cooling to 1000° C. at a cooling rate of 300° C./hour and then cooling in air. The thus obtained aluminum nitride-base ceramic body has a thermal conductivity of 80 W/(m·K).

Formation of Corrosion-Resistant Layer

Figure 1:
FIG. 1 is a scanning electron microphotograph showing a corrosion-resistant layer on a surface of a corrosion-resistant member in Example 1.
Figure 2:
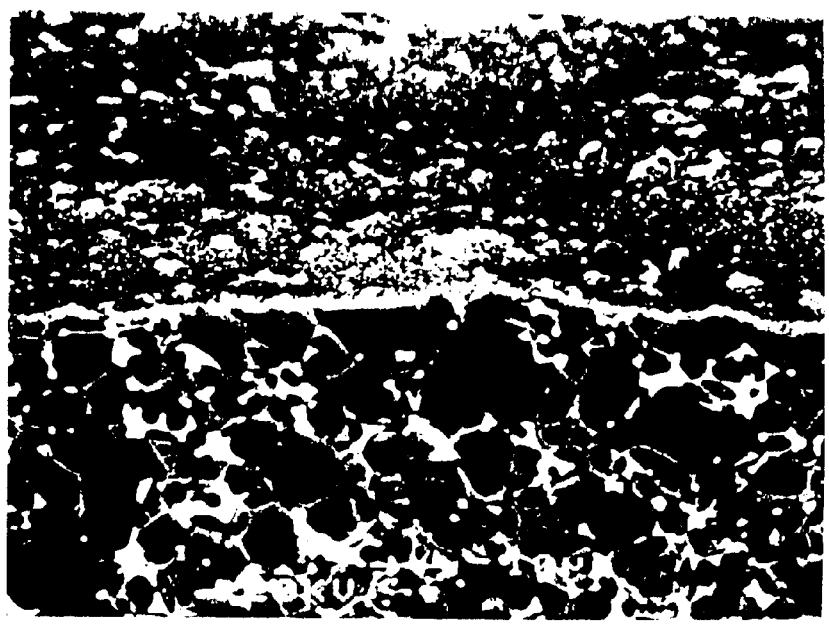
FIG. 2 is a scanning electron microphotograph showing a surface of a corrosion-resistant member and aluminum nitride grains thereunder in Example 1.

The sintered body is held in a $NF_3$ down flow plasma at 700° C. for 2 hours. In this case, $NF_3$ gas is excited by ICP (flow rate of 100 cc/minute at 0° C. under 1 atmospheric pressure, 13.56 MHz and 1 kW ) and a gas pressure is set at 5 Torr. The thus obtained corrosion-resistant member is observed by means of a scanning electron microscope to obtain results as shown in FIGS. 1 and 2. FIG. 1 is a photograph viewing the corrosion-resistant layer from its surface side, and FIG. 2 is a photograph taken from an obliquely upper direction after the corrosion-resistant layer and the aluminum nitride sintered body located thereunder are cut and the cut face is polished.

In the photographed surface region, the presence of a light atom tends to become black and the presence of a heavy atom tends to become white, and an existing ratio of these atoms is showed by light and shade on the photograph. As seen from FIGS. 1 and 2, aluminum nitride grains and gain boundary phase therebetween clearly remain in the corrosion-resistant member other than the surface region thereof. On the other hand, the aluminum nitride grains and the gain boundary phase therebetween do not remain in the surface region, while a great number of very fine grains having substantially a sphere shape of a sub-micron order size uniformly and densely appear on the surface to form the surface layer. There is observed no corrosion on the surface layer.

The aluminum nitride grains as a matrix are blackish, which show the presence of aluminum being a relatively light element. On the other hand, the fine grains existing on the surface are slightly gray, which show the inclusion of elements heavier than aluminum nitride grain. Particularly, a white region is observed from FIG. 1, which shows a portion that a great amount of yttrium exists. Further, the aluminum nitride grains as the matrix are observed from the boudaries among the fine grains constituting the surface layer. Moreover, the thickness of the corrosion-resistant layer is about 0.5 μm.

An elementary distribution of the corrosion-resistant layer is measured by EDS (Energy Dispersive X-ray Spectroscopy). As a result, there are mainly existent aluminum, yttrium, nitrogen, fluorine, and oxygen and the weight ratio of yttrium to a sum of aluminum and yttrium is 30%. And also, yttrium is existent as a fluoride but there is a possibility of remaining of a part of yttrium as garnet. On the surface is lost the film of aluminum fluoride.

The reason can be guessed as mentioned below. Namely, when the sintered body is exposed to $NF_3$ gas plasma, a greater part of $AlF_3$ is evaporated to considerably corrode the aluminum nitride grains. At the same time, it is considered that the grain boundary layer of aluminum nitride grains is also subjected to the corrosion and yttria in the grain boundary layer is fluorinated. In this case, it is considered that the amount of yttrium is small as compared with that of aluminum nitride grain and a large amount of yttrium fluoride hardly aggregates and hence the fine grains having a sub-micron order size are produced on the surface of the aluminum nitride to form the corrosion-resistant layer.

Corrosion Test

The corrosion-resistant member is held in $NF_3$ gas of 600° C. and 1 Torr excited by ICP for 10 hours. In this case, a flow rate is 100 cc/minute at 0° C. under 1 atmospheric pressure and the excitation is carried out at 13.56 MHz and 1 kW. As a result of the measurement of the weight of the corrosion-resistant member before and after the corrosion test, the decreases of 2 mg/cm² is observed after the corrosion test.

EXAMPLE 2

An aluminum nitride sintered body is produced in the same manner as described in Example 1. In this case, calcia is added in an amount of 0.03 part by weight as converted to calcium as a sintering aid. An ion radius of calcium is 1.00 angstrom. The resulting aluminum nitride sintered body has a thermal conductivity of 80 W/(m·K).

The sintered body is held in $CF_4$ down flow plasma at 650° C. for 3 hours. In this case, $CF_4$ gas is excited by ICP (flow rate of 100 cc/minute at 0° C. under 1 atmospheric pressure, 13.56 MHz and 1 kW ) and a gas pressure is set at 5 Torr. The thus obtained corrosion-resistant member is observed by means of a scanning electron microscope to obtain substantially the same results as in Example 1. Further, the thickness of the corrosion-resistant layer is 3 μm, and aluminum, calcium, nitrogen, fluorine, and oxygen are mainly existent therein, and the weight ratio of calcium to a sum of aluminum and calcium is 20%. And also, calcium is existent as a fluoride, but there is a possibility of remaining a part of calcium as garnet. On the surface is lost the film of aluminum fluoride.

As a result of the fact that the same corrosion test as in Example 1 is carried out with respect to the above corrosion-resistant member, the decrease of 5 mg/cm² is observed after the corrosion test.

EXAMPLE 3

An aluminum nitride sintered body is produced in the same manner as described in Example 1. In this case, dilanthanum trioxide is added in an amount of 8.5 parts by weight as converted to lanthanum as a sintering aid. An ion radius of lanthanum is 1.06 angstrom. The thus obtained aluminum nitride sintered body has a thermal conductivity of 140 W/(m·K).

The sintered body is held in $NF_3$ down flow plasma at 650° C. for 3 hours. In this case, $NF_3$ gas is excited by ICP (flow rate of 100 cc/minute at 0° C. under 1 atmospheric pressure, 13.56 MHz and 1 kW) and a gas pressure is set at 5 Torr. The thus obtained corrosion-resistant member has substantially the same result as in Example 1 as a result of the observation of the surface by means of a scanning electron microscope. Further, the thickness of the corrosion-resistant layer is 2 μm, and aluminum, lanthanum, nitrogen, fluorine, and oxygen are mainly existent and the weight ratio of lanthanum to a sum of aluminum and lanthanum is 60%. And also, lanthanum is existent as a fluoride, but there is a possibility of remaining of a part of lanthanum as garnet. On the surface is lost the film of aluminum fluoride.

After the same corrosion test as in Example 1 is carried out with respect to the above corrosion-resistant member, the decrease of 0.1 mg/cm$^2$ is observed.

EXAMPLE 4

An aluminum nitride sintered body is produced in the same manner as described in Example 1. In this case, strontium carbide is added in an amount of 0.89 part by weight as converted to strontium as a sintering aid. An ion radius of strontium is 1.16 angstrom. The thus obtained aluminum nitride sintered body has a thermal conductivity of 150 W/(m·K).

The sintered body is held in $NF_3$ down flow plasma at 700° C. for 2 hours. In this case, $NF_3$ gas is excited by ICP (flow rate of 100 cc/minute at 0° C. under 1 atmospheric pressure, 13.56 MHz and 1 kW) and a gas pressure is set at 5 Torr. The thus obtained corrosion-resistant member has substantially the same result as in Example 1 as a result of the observation of the surface by means of a scanning electron microscope. Further, the thickness of the corrosion-resistant layer is 6 μm, and aluminum, strontium, nitrogen, fluorine, and oxygen are mainly existent and the weight ratio of strontium to a sum of aluminum and strontium is 60%. On the surface is lost the film of aluminum fluoride.

After the same corrosion test as in Example 1 is carried out with respect to the above corrosion-resistant member, the decrease of 0.1 mg/cm$^2$ is observed. EXAMPLE 5

An aluminum nitride sintered body is produced in the same manner as described in Example 1. In this case, calcia is added in an amount of 0.03 part by weight as converted to calcium and yttria is added in an amount of 2.4 parts by weight as converted to yttrium, respectively, as a sintering aid. The thus obtained aluminum nitride sintered body has a thermal conductivity of 170 W/(m·K).

The sintered body is held in $NF_3$ down flow plasma at 700° C. for 2 hours. In this case, $NF_3$ gas is excited by ICP (flow rate of 100 cc/minute at 0° C. under 1 atmospheric pressure, 13.56 MHz and 1 kW) and a gas pressure is set at 5 Torr. The thus obtained corrosion-resistant member has substantially the same result as in Example 1 as a result of the measurement of the surface by means of a scanning electron microscope. Further, the thickness of the corrosion-resistant layer is 5 μm, and aluminum, calcium, yttrium, nitrogen, fluorine, and oxygen are mainly existent and the weight ratio of calcium and yttrium to a sum of aluminum, calcium and yttrium is 35%. On the surface is lost the film of aluminum fluoride.

After the same corrosion test as in Example 1 is carried out with respect to the above corrosion-resistant member, the decrease of 6 mg/cm$^2$ is observed.

COMPARATIVE EXAMPLE 1

An aluminum nitride sintered body is produced in the same manner as described in Example 1. The sintered body is held in $ClF_3$ gas 600° C. for 3 hours, provided that the pressure of $ClF_3$ gas is set at 5 Torr.

Figure 3:
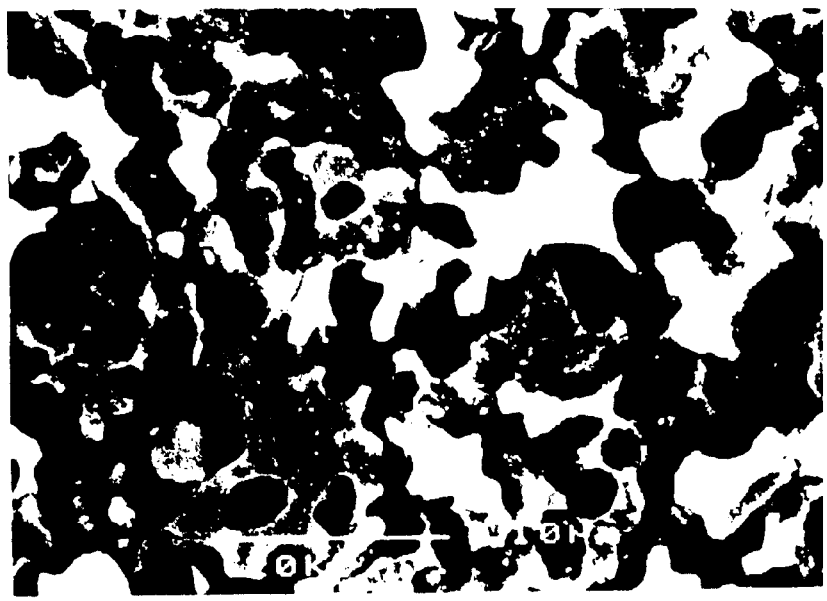
FIG. 3 is a scanning electron microphotograph showing aluminum nitride grains on a surface of a corrosion-resistant member in Comparative Example 1.
Figure 4:
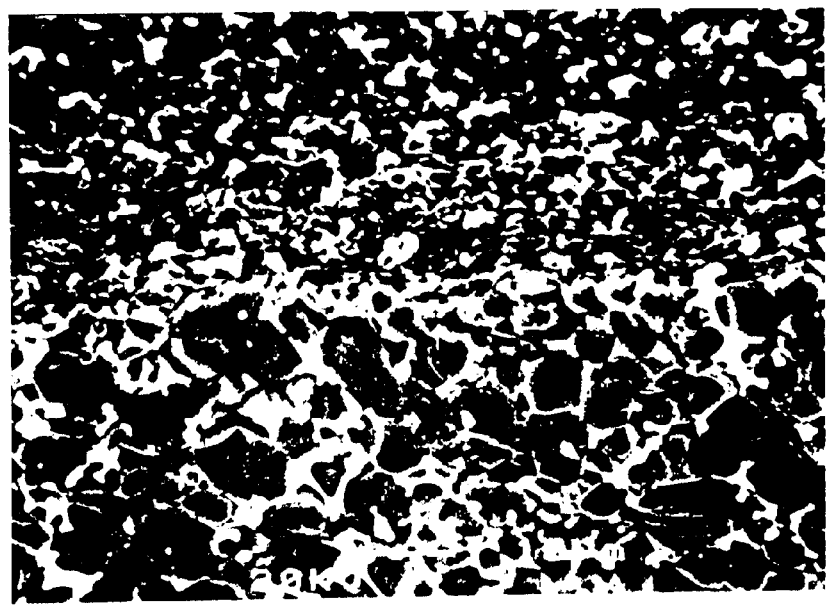
FIG. 4 is a scanning electron microphotograph showing a surface of a corrosion-resistant member and aluminum nitride grains thereunder in Comparative Example 1.

The thus obtained corrosion-resistant member is observed by means of a scanning electron microscope to obtain results as shown in FIGS. 3 and 4. FIG. 3 is a photograph viewing the corrosion-resistant layer from the surface side thereof, and FIG. 4 is a photograph taken from an obliquely upper direction after the corrosion-resistant layer and aluminum nitride sintered body as the matrix are cut and then the cut face is polished.

In the surface region of the corrosion-resistant member, the aluminum nitride grains just being corroded and the grain boundary phase therebetween appear. That is, the corrosion proceeds toward the inside of each grain. Further, aluminum fluoride layer is not observed.

After the same corrosion test as in Example 1 is carried out with respect to the above corrosion-resistant member, the decrease of 40 mg/cm$^2$ is observed.

COMPARATIVE EXAMPLE 2

An aluminum nitride sintered body is produced in the same manner as described in Example 1. After the same corrosion test as in Example 1 is carried out with respect to the resulting sintered body, the decrease of 100 mg/cm$^2$ is observed. EXAMPLE 6

There is provided a main body having a planar shape of 20 mm in length, 20 mm in width and 1 mm in thickness, provided that a material of the main body is metal aluminum (JIS A 1050: 95% aluminum), alumina (95% dense alumina), aluminum nitride (95% or 99.9%), quarts glass or silicon carbide (dense silicon carbide obtained by pressure-less sintering). Then, a corrosion-resistant layer of magnesium fluoride having a thickness of 1 μm is formed on the main body by magnetron sputtering. In this case, the conditions are a sputtering pressure of 0.7–5 Pa, 200 W, 1–10 hours and an argon flow rate of 18 cc/minute at 0° C. under 1 atmospheric pressure.

Each of the resulting corrosion-resistant members is held in $ClF_3$ plasma of 600° C. and 0.1 Torr excited by ICP for 5 hours. The flow rate of $ClF_3$ is 75 cc/minute at 0° C. under 1 atmospheric pressure and that of argon is 5 cc/minute at 0° C. under 1 atmospheric pressure. After the weight of the corrosion-resistant member is measured before and after the corrosion test, the corrosion weight loss of any members is less than 0.1 mg/cm$^2$, and there is observed no peeling and cracking of the corrosion-resistant layer.

EXAMPLE 7

There is provided a main body having a planar shape of 20 mm in length, 20 mm in width and 1 mm in thickness, provided that a material of the main body is a dense aluminum nitride (96%). Then, a corrosion-resistant layer having a thickness of 1 μm and made of magnesium fluoride, calcium fluoride, yttrium fluoride or $MgF_2/YF_3/AlN$ is formed on the main body by magnetron sputtering. The conditions are a sputtering pressure of 0.7–5 Pa, 200 W, 1–10 hours and an argon flow rate of 18 cc/minute at 0° C. under 1 atmospheric pressure.

Each of the resulting corrosion-resistant members is held in ClF$_3$ plasma of 600° C. and 0.1 Torr excited by ICP for 5 hours. The flow rate of ClF$_3$ is 75 cc/minute at 0° C. under 1 atmospheric pressure and that of argon is 5 cc/minute at 0° C. under 1 atmospheric pressure. After the weight of each corrosion-resistant member is measured before and after the corrosion test, the corrosion weight loss of any members is less than 0.1 mg/cm$^2$, and there is observed no peeling and cracking of the corrosion-resistant layer.

EXAMPLE 8

There is provided a main body having a planar shape of 20 mm in length, 20 mm in width and 1 mm in thickness, provided that a material of the main body is dense silicon nitride (99%). Then, a corrosion-resistant layer of magnesium fluoride having a thickness of 0.2 μm, 1 μm or 4 μm is formed on the main body by magnetron sputtering. The conditions are a sputtering pressure of 0.7–5 Pa, 200 W, 1–10 hours and an argon flow rate of 18 cc/minute at 0° C. under 1 atmospheric pressure.

Each of the resulting corrosion-resistant members is held in ClF$_3$ plasma of 600° C. and 0.1 Torr excited by ICP for 5 hours. The flow rate of ClF$_3$ is 75 cc/minute at 0° C. under 1 atmospheric pressure and that of argon is 5 cc/minute at 0° C. under 1 atmospheric pressure. After the weight of each corrosion-resistant member is measured before and after the corrosion test, the corrosion weight loss of any members is less than 0.1 mg/cm$^2$, and there is observed no peeling and cracking of the corrosion-resistant layer.

COMPARATIVE EXAMPLE 3

The same corrosion test as in Example 8 is applied to a main body obtained in the same manner as in Example 8 except that the corrosion-resistant layer is not formed on the main body of dense silicon nitride (99%). As a result, the corrosion weight loss is 16 mg/cm$^2$.

EXAMPLE 9

A corrosion-resistant layer of magnesium fluoride having a thickness of 1 μm is formed on a heater of 96% dense aluminum nitride by an ion plating method.

The heater is subjected to a heat cycle test in ClF$_3$ plasma of 0.1 Torr excited by ICP. The flow rate of ClF$_3$ is made 75 cc/minute at 0° C. under 1 atmospheric pressure and that of argon is 5 cc/minute at 0° C. under 1 atmospheric pressure. Five cycles of temperature rising and dropping are repeated between 200° C. and 700° C. In each cycle, it is held at 700° C. for 1 hour. The corrosion weight loss of the heater after the corrosion test is less than 0.1 mg/cm$^2$, and there is observed no peeling and cracking of the corrosion-resistant layer.

Figure 5:
FIG. 5 is a scanning electron microphotograph showing a section of a corrosion-resistant layer before the exposure to a plasma in a corrosion-resistant member of Example 9.
Figure 6:
FIG. 6 is a scanning electron microphotograph showing a section of a corrosion-resistant layer after the exposure to a plasma in a corrosion-resistant member of Example 9.

FIG. 5 is a scanning electron microphotograph showing a polished cut face of the corrosive-resistant layer at its section before the exposure to the plasma, and FIG. 6 is a scanning electron microphotograph showing a polished cut face of the corrosion-resistant layer at its section after the exposure to the plasma. As seen from these photographs, the corrosion-resistant layer does not show remarkable change even after the exposure to the plasma, and there are not observed defects such as peeling, cracking and the like and the other change in quality.

EXAMPLE 10

A corrosioii-resistant layer of magnesium fluoride having a thickness of 1 μm is formed on a cover plate (disc shape having a diameter of 210 mm and a thickness of 10 mm) of 99.9% dense aluminum nitride by magnetron sputtering under the same condition as in Example 6.

The cover plate is subjected to a heat cycle test in ClF$_3$ plasma of 0.1 Torr excited by ICP. The flow rate of ClF$_3$ is 75 cc/minute at 0° C. under 1 atmospheric pressure and that of argon is 5 cc/minute at 0° C. under 1 atmospheric pressure. Five cycles of temperature rising and dropping are repeated between 200° C. and 715° C. During 5 heat cycles, it is held at 715° C. for 78 hours in total. After the corrosion test, the corrosion weight loss of the cover plate is less than 0.1 mg/cm$^2$, and there is observed no peeling and cracking of the corrosion-resistant layer.

As mentioned above, according to the invention, even when the corrosion-resistant member is exposed to the plasma of the halogen based corrosive gas over a wide temperature range of from a low temperature to a high temperature, especially in a high temperature region of not lower than 500° C., the corrosion of the surface of the corrosion-resistant member and the occurrence of particles can be prevented.

What is claimed is:

1. A corrosion-resistant member having a resistance to plasma of a halogen based corrosive gas, comprising (1) an aluminum nitride-base ceramic main body and (2) a corrosion-resistant uncovered top surface layer formed on a surface of the main body, in which the corrosion-resistant layer contains a fluoride of an alkaline earth element.

2. The corrosion-resistant member of claim 1, wherein the corrosion-resistant layer is a film of a fluoride.

3. The corrosion-resistant member of claim 1, wherein the fluoride is magnesium fluoride.

4. The corrosion-resistant member of claim 2, wherein the fluoride is magnesium fluoride.

5. The corrosion-resistant member of claim 1, wherein the main body is an aluminum nitride-base ceramic.

6. The corrosion-resistant member of claim 1, wherein the corrosion-resistant layer has a thickness of not less than 0.2 μm but not more than 10 μm.

7. The corrosion-resistant member of claim 1, wherein the corrosion-resistant layer is made of a particle substance including a fluoride of an alkaline earth element.

8. A corrosion-resistant member having a resistance to plasma of a halogen based corrosive gas, comprising (1) an aluminum nitride-base ceramic main body and (2) a corrosion-resistant uncovered top surface layer formed on a surface of the main body, in which the corrosion-resistant layer contains a fluoride of a rare earth element.

* * * * *